(12) United States Patent  
Shimatsu et al.

(10) Patent No.: US 8,076,012 B2  
(45) Date of Patent: Dec. 13, 2011

(54) MAGNETIC THIN FILM AND METHOD FOR FORMING THE FILM, AND MAGNETIC THIN FILM-APPLIED DEVICE

(75) Inventors: Takehito Shimatsu, Sendai (JP); Hideo Sato, Sendai (JP); Osamu Kitakami, Sendai (JP); Satoshi Okamoto, Sendai (JP); Hajime Aoi, Sendai (JP); Hiroyasu Kataoka, Tokyo (JP)

(73) Assignees: Tohoku University (JP); Fuji Electric Co., Ltd. (JP)

( * ) Notice: Subject to any disclaimer, the term of this patent is extended or adjusted under 35 U.S.C. 154(b) by 83 days.

(21) Appl. No.: 12/510,878

(22) Filed: Jul. 28, 2009

(65) Prior Publication Data

US 2010/0055503 A1    Mar. 4, 2010

(30) Foreign Application Priority Data

Jul. 28, 2008   (JP) ................. 2008-193156

(51) Int. Cl.  
*G11B 5/65* (2006.01)

(52) U.S. Cl. .................. 428/812; 428/826.1; 428/692.1; 360/324

(58) Field of Classification Search ........................ None  
See application file for complete search history.

(56) References Cited

U.S. PATENT DOCUMENTS

| | | | | |
|---|---|---|---|---|
| 2007/0160824 A1* | 7/2007 | Ichihara et al. | ............ | 428/304.4 |
| 2010/0140727 A1* | 6/2010 | Shimatsu et al. | ............ | 257/421 |
| 2011/0020669 A1* | 1/2011 | Sayama et al. | ................ | 428/831 |

FOREIGN PATENT DOCUMENTS

| | | |
|---|---|---|
| JP | 2001-101645 A | 4/2001 |
| JP | 2002-208129 A | 7/2002 |
| JP | 2002-216330 A | 8/2002 |
| JP | 2003-173511 A | 6/2003 |
| JP | 2004-311607 A | 11/2004 |
| JP | 2004-311925 A | 11/2004 |
| JP | 2005-333106 A | 12/2005 |
| JP | 2006-085825 A | 3/2006 |
| WO | 2004/034385 A1 | 4/2004 |

OTHER PUBLICATIONS

IDS reference Sato et al. (J. App. Phys., 103, 07E114-1 to 07E114-3, 2008).*  
Shimatsu, T., Sato, H., Mitsuzuka, K., Kataoka,H., Aoi, H., Okamoto, S., and Kitakami, O., J. App. PHys., 105, 07C109, 2009.*

(Continued)

*Primary Examiner* — Kevin Bernatz  
(74) *Attorney, Agent, or Firm* — Rossi, Kimms & McDowell LLP

(57) ABSTRACT

Disclosed are a magnetic thin film capable of providing a high uniaxial magnetic anisotropy, Ku, while suppressing the saturation magnetization Ms thereof, and a method for forming the film; and also disclosed are various devices to which the magnetic thin film is applied. The magnetic thin film comprises a Co-M-Pt alloy having an L11-type ordered structure (wherein M represents one or more metal elements except Co and Pt). For example, the Co-M-Pt alloy is a Co—Ni—Pt alloy of which the composition comprises from 10 to 35 at. % of Co, from 20 to 55 at. % of Ni and a balance of Pt. The magnetic thin film is applicable to perpendicular magnetic recording media, tunnel magneto-resistance (TMR) devices, magnetoresistive random access memories (MRAM), microelectromechanical system (MEMS) devices, etc.

19 Claims, 6 Drawing Sheets

OTHER PUBLICATIONS

Jang, P., Kim, D., Park, C., Na, J., and Lee, S., J. App. Phys., 83(11), 6614, 1998.*

Kim., T., Cadevill, M., Dinia, A., and Rakoto, H., J. App. Phys., 81(8), 5273, 1997.*

Nakahigashi, K., and Shinoya, Y., Jap. J. App. Phys., 22(12), 1790-1793, 1983.*

Sato, H., Shimatsu, T., Kataoka, H., Aoi, H., Okamoto, S., and Kitakami, O., J. App. Phys., 105, 07B726, 2009.*

Lai, Y., Chang, Y., Chen, Y., Lin, H., and Chen, G., J. Mater. Sci., 42:6887-6894, 2007.*

S. Okamoto et al., "Chemical-order-dependent magnet anisotropy and exchange stiffness constant of FePt (001) epitaxial films", Physical Review B 66, 024413 (2002) pp. 1-9.

H. Sato et al., "Fabrication of L11 type Co-Pt ordered alloy films by sputter deposition", Journal of Applied Physics 103, 07E114 (2008) pp. 1-3.

Y. Inaba et al., "Magnetic Properties of Hard/Soft-Stacked Perpendicular Media Having Very Thin Soft Layers with a High Saturation Magnetization", Journal of the Magnetics Society of Japan, vol. 31, No. 3, 2007, pp. 178-183. English Abstract provided.

* cited by examiner

MAGNETIC THIN FILM AND METHOD FOR FORMING THE FILM, AND MAGNETIC THIN FILM-APPLIED DEVICE

BACKGROUND OF THE INVENTION

1. Field of the Invention

The present invention relates to a magnetic thin film and a method for forming the film, and to a magnetic thin film-applied device, in particular to a magnetic thin film that comprises an alloy having an L11-type ordered structure and to a method for forming the film, and also to a device to which the film is applied. The magnetic thin film-applied device includes typically magnetic recording media such as perpendicular magnetic recording media, as well as tunnel magneto-resistance (TMR) devices, magnetoresistive random access memories (MRAM), microelectromechanical system (MEMS) devices; and in addition, the film is widely applicable to other known magnetic thin film-having devices and the like in accordance with their needs.

2. Background Art

Of those magnetic thin film-having devices, magnetic recording media, tunnel magneto-resistance (TMR) devices, magnetoresistive random access memories (MRAM), MEMS devices and the like are described in brief. First described is a magnetic recording medium.

A magnetic recording system for use in a magnetic recording apparatus, such as a hard disc, a magneto-optical (MO) disc, a magnetic tape or the like includes two types of a longitudinal magnetic recording system and a perpendicular magnetic recording system. For the magnetic recording system for a hard disc, a longitudinal magnetic recording system where magnetic recording is attained longitudinally to the surface of a disc has been employed for many years, but from about 2005, a perpendicular magnetic recording system where magnetic recording is attained perpendicularly to the surface of a disc has become employed as enabling a higher recording density; and as a result, perpendicular magnetic recording media have become used for magnetic recording media. Perpendicular magnetic recording media are disclosed, for example, in Patent Reference 1. Patent Reference 1 discloses examples of perpendicular magnetic recording media excellent in noise reduction, thermal stability and writability, enabling high-density recording and bringing about cost reduction.

FIG. 1 and FIG. 2 are examples of the constitution of the perpendicular magnetic recording medium disclosed in Patent Reference 1. The perpendicular magnetic recording medium shown in FIG. 1 has a structure of an underlayer 3, a magnetic layer 4 and a protective layer 5 formed in that order on a non-magnetic substrate 1. The perpendicular magnetic recording medium shown in FIG. 2 has a structure where a seed layer 2 is provided between the underlayer 3 and the non-magnetic substrate 1 for the purpose of controlling the crystal alignment and the crystal particle size in the underlayer 3.

Also known is a perpendicular double-layer medium having a soft magnetic layer provided between a substrate and a perpendicular magnetic layer. A soft magnetic layer may be provided between the non-magnetic substrate 1 and the underlayer 3 in FIG. 1; and between the non-magnetic substrate 1 and the seed layer 2 in FIG. 2.

As the material for the magnetic recording layer (magnetic layer) of the perpendicular magnetic recording medium, at present, a CoPt-base alloy crystalline film is mainly used, and for use for perpendicular magnetic recording, the crystal alignment in the film is so controlled that the c-axis of the CoPt-base alloy, which has a hexagonal closed packed (hcp) structure, could be perpendicular to the film surface (that is, the c-plane thereof could be parallel to the film surface).

As one system of magnetic layer structure control, proposed is a magnetic layer having a structure of a ferromagnetic crystal grain surrounded by a non-magnetic non-metallic substance such as oxide or nitride, generally referred to as a granular magnetic layer, in a perpendicular magnetic recording medium. It is considered that, in the granular magnetic film of the type, the non-magnetic non-metallic grain boundary phase could act to physically separate the ferromagnetic grains from each other, in which, therefore, the magnetic interaction between the ferromagnetic grains could be lowered and the formation of zigzag magnetic walls to occur in the transition region of recording bits could be inhibited, thereby bringing about noise reduction.

Aiming at further increase in the recording density in perpendicular magnetic recording media, development of discrete track media (DTM) having grooves formed between tracks for reducing the magnetic interferences of the neighboring tracks therebetween, and also development of bit patterned media (BPM) having magnetic grains artificially regularly aligned therein for enabling one bit recording by one magnetic grain are actively under way in the art.

Further, for making it possible to record on a magnetic film having a high coercive force, a heat-assisted magnetic recording (HAMR) or thermal-assisted magnetic recording (TAMR) system is under investigation, and magnetic recording media applicable to the recording system are also under investigation.

Next described are tunnel magneto-resistance (TMR) devices, magnetoresistive random access memories (MRAM), etc. In conventional memories such as flash memories and DRAM, recording is based on the electrons inside the memory cell; however, as opposed to these, MRAM is a memory technique in which a same magnetic substance as in hard discs or the like is used as the memory medium therein. FIG. 3 shows the schematic constitution of MRAM (source: "Current Situation and Problems of Spin-Transfer Magnetization Switching", "Materia Vol. 42, No. 9", Sep. 20, 2003, written by Kojiro Yagami et al., issued by the Japan Institute of Metals, p. 646, FIG. 10). In MRAM, the address access time is on a level of 10 nsec and the cycle time is on a level of 20 nsec, which are about 5 times those in DRAM; or that is, MRAM enables rapid reading and writing, as comparable to SRAM. Another advantage of MRAM is that its power consumption is about ⅒ that of flash memory and is low, and it enables large-scale integration.

As in FIG. 3a, "TMR effect" is applied to MRAM, in which a thin insulator film having a thickness of about a few atoms is sandwiched between two magnetic thin films in such a manner that the magnetization direction of one magnetic thin film is varied relative to that of the other to thereby change the resistance value of the system. Specifically, as in FIG. 3b, the tunnel magneto-resistance (TMR) device is used in MRAM.

As another embodiment, the tunnel magneto-resistance (TMR) device may have a structure of a ferromagnetic thin film formed on an antiferromagnetic thin film. The tunnel magneto-resistance device having the structure of the type is disclosed, for example, in FIG. 5 in Patent Reference 9. In addition, FIG. 4 in Patent Reference 9 discloses a spin valve-type magneto-resistance device; and like the above-mentioned tunnel magneto-resistance device, this also has a structure of a ferromagnetic thin film formed on an antiferromagnetic thin film.

Next described is an MEMS device. MEMS is meant to indicate a device where mechanical parts, sensors, actuators and electronic circuits are integrated on one silicon substrate, glass substrate, organic material or the like. Its technical application examples include DMD (digital micromirror device), a type of optical devices in projectors, as well as micronozzles and various sensors such as pressure sensors, acceleration sensors, flow rate sensors and the like as in the head of inkjet printers, etc. In future, its application is expected not only in the filed of manufacturing industry but also in the field of medicine. In the MEMS device, a magnetic thin film is partly used.

In the above-mentioned various devices, it is desired to enhance the magnetic properties of the magnetic thin film, and the development of perpendicular magnetization films having a large uniaxial magnetic anisotropy, Ku is indispensable for further advanced capacity increase and density increase in recording media and memories in future. In particular, in perpendicular magnetic recording media, a magnetic recording layer having a double-layered particle or dot with a hard layer and a soft layer, such as ECC (exchange-coupled composite), hard/soft stacked, exchange-spring or the like layer, has been proposed as the magnetic recording layer in the coming high-density magnetic recording media. However, for fully exhibiting the properties of those media to realize the good thermal stability and the excellent saturation recording properties thereof, it is necessary to use a perpendicular magnetization film having a uniaxial magnetic anisotropy, Ku on a level of $10^7$ erg/cm$^3$, as the hard film in the media. On the other hand, also in spin-transfer magnetization switching MRAM that are expected as high-density memories in future, a perpendicular magnetization film having a large uniaxial magnetic anisotropy, Ku on a level of $10^7$ erg/cm$^3$ is being used for realizing further advanced capacity increase in those memories.

In the above, the Ku unit is expressed by "erg/cm$^3$"; and when it is converted into the corresponding SI unit, then erg/cm$^3$=$10^{-1}$ J/m$^3$ shall be employed. In case where the unit "emu/cm$^3$" of saturation magnetization to be mentioned below is converted into the corresponding SI unit, then 1 emu/cm$^3$=$10^3$ A/m shall be employed.

As the above-mentioned perpendicular magnetization film having a large Ku, Non-Patent Reference 1 discloses a Co—Pt L1$_1$-type ordered alloy film. In addition, Non-Patent Reference 2 and Patent Reference 8 disclose an Fe—Pt L1$_0$-type ordered alloy film. Further, Patent References 2, 3, 4, 5, 6 and 7 disclose magnetic recording media comprising an L1$_0$-type ordered alloy such as an Fe—Pt ordered alloy, an Fe—Pd ordered alloy or a Co—Pt ordered alloy, or a magnetic layer thereof.

In particular, a further increased Ku can be expected by increasing the degree of order of the Co—Pt L1$_1$-type ordered alloy film described in Non-Patent Reference 1.

However, for application to perpendicular magnetic recording media, the magnetic film must have not only an increased large uniaxial magnetic anisotropy Ku but also a suitably controlled saturation magnetization Ms. This is described in detail, for example, in Non-Patent Reference 3. The left column on page 180 in Non-Patent Reference 3 says as follows, based on FIG. 3 and FIG. 4: "The saturation magnetization value Ms is thermally stable within a region of from 300 to 700 emu/cm$^3$, and even in no consideration of the reduction in the coercive force owing to thermal decay, the saturation magnetization Ms must be at most 600 emu/cm$^3$ in order to keep the squareness ratio of the magnetization curve at 1."

Specifically, the magnetic thin film for use in various devices must have a high uniaxial magnetic anisotropy Ku while having a reduced saturation magnetization Ms in accordance with the object thereof.

Patent Reference 1: JP-A 2006-85825
Patent Reference 2: JP-A 2002-208129
Patent Reference 3: JP-A 2003-173511
Patent Reference 4: JP-A 2002-216330
Patent Reference 5: JP-A 2004-311607
Patent Reference 6: JP-A 2001-101645
Patent Reference 7: WO2004/034385
Patent Reference 8: JP-A 2004-311925
Patent Reference 9: JP-A 2005-333106
Non-Patent Reference 1: H. Sato, et al., "Fabrication of L11 type Co—Pt ordered alloy films by sputter deposition", J. Appl. Phys., 103, 07E114 (2008)
Non-Patent Reference 2: S. Okamoto, et al., "Chemical-order-dependent magnetic anisotropy and exchange stiffness constant of FePt (001) epitaxial films", Phys. Rev. B, 66, 024413 (2002)
Non-Patent Reference 3: Y. Inaba, et al., "Magnetic Properties of Hard/Soft-Stacked Perpendicular Media Having Very Thin Soft Layers with a High Saturation Magnetization", J. Magn. Soc. Jpn., 31, 178 (2007)

SUMMARY OF THE INVENTION

The invention has been made in consideration of the above, and its object is to provide a magnetic thin film capable of providing a high uniaxial magnetic anisotropy, Ku, while suppressing the saturation magnetization Ms thereof, and a method for forming the film, and to provide various devices to which the magnetic thin film is applied.

The object can be attained by the following. Specifically, the magnetic thin film of the invention comprises a Co-M-Pt alloy having an L11-type ordered structure (wherein M represents one or more metal elements except Co and Pt) (claim 1).

The magnetic thin film of the invention has a granular structure that comprises ferromagnetic crystal grains of mainly a Co-M-Pt alloy having an L11-type ordered structure (wherein M represents one or more metal elements except Co and Pt) and a non-magnetic grain boundary surrounding them (claim 2).

In the magnetic thin film of claim 1 or 2, the magnetization easy axis of the film is oriented perpendicularly to the film surface (claim 3).

In the magnetic thin film of any one of claims 1 to 3, the Co-M-Pt alloy is preferably a Co—Ni—Pt alloy or a Co—Ni-M2-Pt alloy (wherein M2 represents one or more metal elements except Co, Ni and Pt) (claim 4).

In the magnetic thin film of any one of claims 1 to 3, the Co-M-Pt alloy is preferably a Co—Ni—Pt alloy of which the composition comprises from 10 to 35 at. % of Co, from 20 to 55 at. % of Ni and a balance of Pt (claim 5).

In the magnetic thin film of any one of claims 1 to 3, the Co-M-Pt alloy may be a Co—Fe—Pt alloy or a Co—Fe-M3-Pt alloy (wherein M3 represents one or more metal elements except Co, Fe and Pt) (claim 6).

As the invention of the method for forming the magnetic thin film, preferred is the following. Specifically, the method is for forming, on a substrate, a magnetic thin film of any one of claims 1 to 6, and is a high-vacuum magnetron sputtering method wherein the substrate temperature is within a range of from 150° C. to 500° C. and the vacuum degree before film formation is at most $1 \times 10^{-4}$ Pa (claim 7).

In the method of claim 7 for forming a magnetic thin film, the substrate temperature is preferably from 270° C. to 400° C. (claim 8).

In the method of claim 7 or 8 for forming a magnetic thin film, the vacuum degree is preferably at most $7 \times 10^{-7}$ Pa (claim 9).

As the invention of various devices, preferred are the following. Specifically, the invention is a perpendicular magnetic recording medium having at least a magnetic layer formed on a substrate, wherein the magnetic layer is a magnetic thin film of any one of claims 1 to 6 (claim 10).

The invention further includes a tunnel magneto-resistance device having a magnetic thin film of any one of claims 1 to 6 (claim 11); a magnetoresistive random access memory having a magnetic thin film of any one of claims 1 to 6 (claim 12); an MEMS device having a magnetic thin film of any one of claims 1 to 6 (claim 13).

Figure 1:
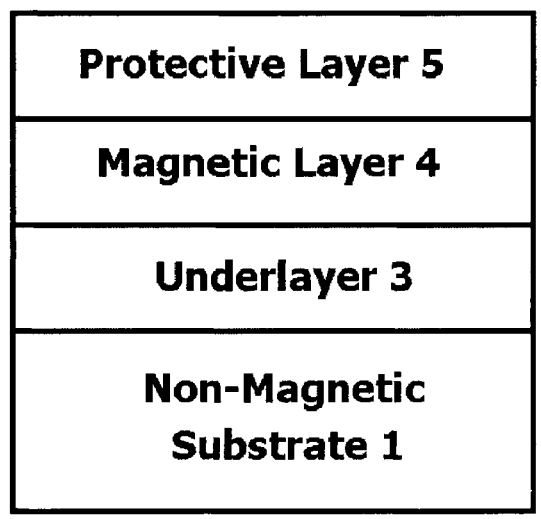
FIG. 1 is a schematic cross-sectional view of a perpendicular magnetic recording medium of one embodiment of the invention.
Figure 2:
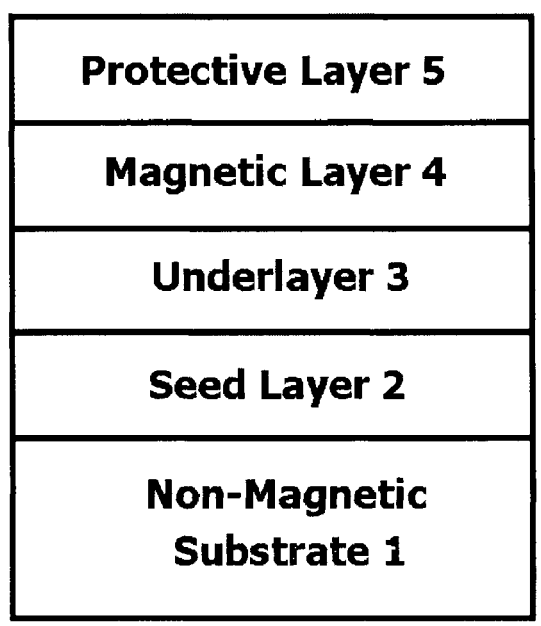
FIG. 2 is a schematic cross-sectional view of a perpendicular magnetic recording medium of another embodiment of the invention, differing from FIG. 1.
Figure 3A:
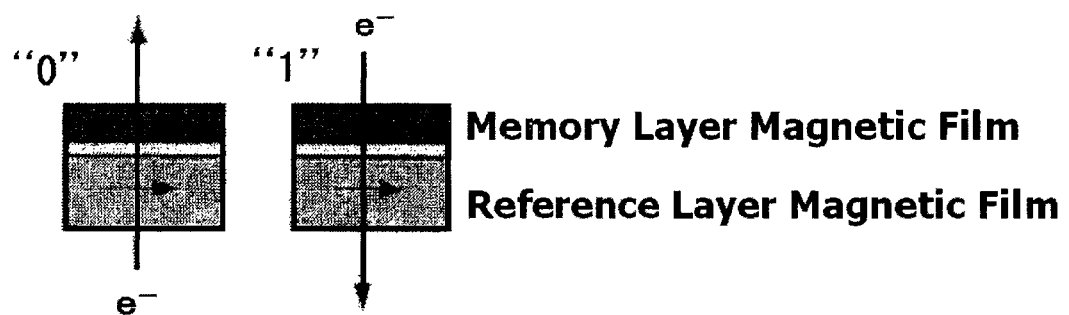
FIG. 3 shows a schematic constitution of a magnetoresistive random access memory (MRAM) having a tunnel magneto-resistance (TMR) device of one embodiment of the invention.
Figure 3B:
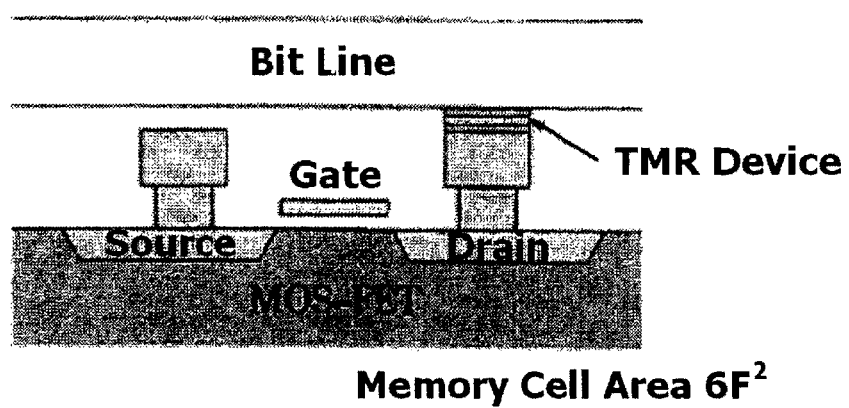

In the drawings, 1 is a non-magnetic substrate, 2 is a seed layer, 3 is an underlayer, 4 is a magnetic layer, and 5 is a protective layer.

DETAILED DESCRIPTION OF THE INVENTION

The outline and the advantages of the L11-type ordered structure and the magnetic thin film of an alloy having the structure, as well as the outline of the method of forming the magnetic thin film are described below, with reference to a Co—Ni—Pt alloy as one embodiment of the invention. The same shall apply also to another Co—Fe—Pt alloy of the invention from the viewpoint of the technical idea of the invention, though there may be some partial differences in point of the properties and the like therebetween.

The $L1_1$-type structure is a crystal structure with a basis of an fcc structure, having a periodic regularity in point of the atomic position therein. Concretely, in the structure, the closest atomic plane, (111 plane) has a laminate structure of an atomic layer plane having a main ingredient of (Co—Ni) and an atomic layer plane having a main ingredient of Pt as alternately laminated one by one. For example, a completely-ordered $L1_1$-type structure of a $(Co—Ni)_{50}Pt_{50}$ composition, in which the constitutive atoms are ordered all at the individual ideal positions, is meant to indicate a structure where an atomic layer plane of Co—Ni alone and an atomic layer plane of Pt alone are alternately laminated one by one. In fact, it may be impossible to constitute such an ideal structure, but it is desirable to enlarge as much as possible the ratio S/Smax, that is, the degree of order as normalized by the maximum value Smax of a theoretically practicable degree of order, in consideration of the stoichiometric ratio of the existing atoms.

Next described are the outline and the advantages of the $L1_1$-type Co—Ni—Pt thin film.

1) The $L1_1$-type Co—Ni—Pt film has a large uniaxial magnetic anisotropy Ku, and is superior to an $L1_0$-type Fe—Pt ordered alloy film that is generally widely known as one having a high Ku, in the following points:

(1) When the degree of order of the atomic configuration is increased therein, then the $L1_1$-type film may have a further larger Ku than that of the $L1_0$-type Fe—Pt ordered alloy film.

(2) The $L1_1$-type film can be formed at a relatively low substrate temperature of from 150 to 500° C., more preferably from 270 to 400° C. The well-known $L1_0$-type Fe—Pt film can be formed at the substrate temperature of about 600° C.

(3) The $L1_1$-type film is excellent in the capability of crystal orientation, or that is, in the ability of controlling the perpendicular orientation of the magnetization easy axis, <111> axis thereof.

2) In addition, Ku and the saturation magnetization Ms of the $L1_1$-type Co—Ni—Pt film both vary, depending on the composition of the film, and therefore, Ku and Ms of the film can be controlled by changing the composition thereof. In particular, substituting Co with Ni in the film realizes increased Ku of the film with suppressing Ms thereof, as compared with that of the Co—Pt binary system, and its details are described hereinunder. Specifically, as compared with the binary alloy composition having the same Ms, the substituted ternary alloy may have a region having a higher Ku than that of the binary alloy. In addition, the ternary alloy may realize the same characteristics as those of the corresponding Co—Pt binary alloy, even though having a lower Pt concentration than the binary alloy.

Next described is the method for forming the magnetic thin film.

The magnetic thin film of the invention can be formed according to an ultra-high vacuum magnetron sputtering method, in which it is important that the vacuum degree is an ultra-high vacuum degree for forming the $L1_1$-type structure having a high degree of order. The film could not be formed at least in an apparatus not good in point of the vacuum degree therein. For example, when an MgO (111) monocrystalline substrate is used, then a monocrystalline film can be formed thereon in which the magnetization easy axis, <111> axis is oriented perpendicularly to the film surface. When a substrate of good smoothness such as a glass disc, a thermal oxidation film-having Si substrate or the like is used, then a polycrystalline film can be formed thereon in which the magnetization easy axis, <111> axis is oriented perpendicularly to the film surface. For both the monocrystalline film and the polycrystalline film, preferred is an underlayer of Ru or Pt. The substrate temperature is preferably around 360° C., at which films having a highest degree of order can be formed. The formed $L1_1$-type structure is stable especially at a temperature of up to around 400° C., and except for some special cases, the structure is excellent in thermal stability in practical use.

According to the invention, there may be provided a magnetic thin film capable of providing a high uniaxial magnetic anisotropy Ku while suppressing the saturation magnetization Ms thereof, and a method for forming the film, and there may also be provided various devices to which the magnetic thin film is applied and which are favorable in accordance with the needs thereof.

Description of the Preferred Embodiments

Now described are embodiments of the invention. First described are examples of magnetic thin films of a Co—Ni—Pt alloy or a Co—Fe—Pt alloy having an L11-type ordered structure, with reference to FIG. 4 to FIG. 8.

Figure 4:
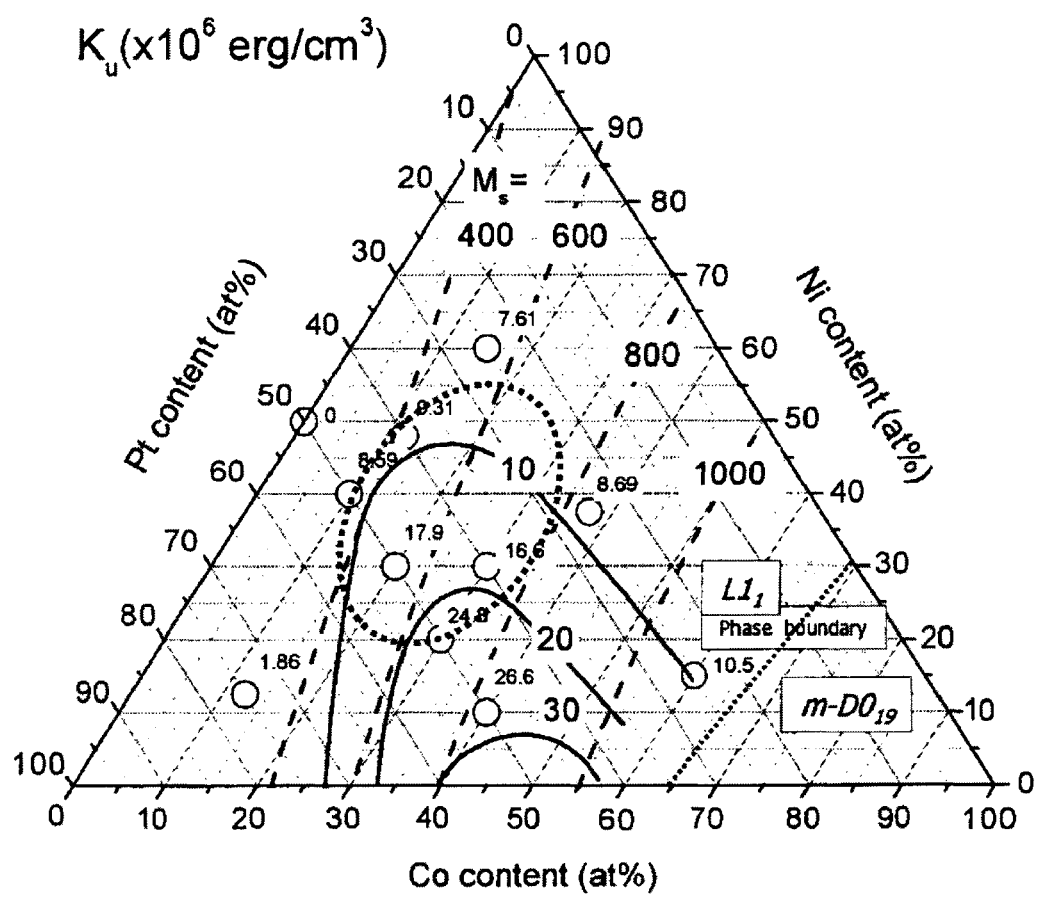
FIG. 4 is a graph showing the composition dependence of Ku and Ms of $L1_1$-Co—Ni—Pt perpendicular magnetization films of examples of the invention.

FIG. 4 is a graph showing the composition dependence of Ku and Ms of $L1_1$-Co—Ni—Pt perpendicular magnetization films of examples of the invention, in which the varying Co—Ni—Pt composition (at. %) is expressed by ternary meshes, and the perpendicular magnetization film is formed on an MgO (111) substrate at a substrate temperature of 360° C. On the right lower side of FIG. 4, an $L1_1$-type structure can be realized in the broad region on the more left side than the relatively thin dotted line expressed to be a phase boundary. In the narrow region on the more right side than the dotted line, an m-$D0_{19}$-type structure is formed, different from the $L1_1$-type structure.

In FIG. 4, a Ku value is given to the points marked with "○"; and the equivalent value lines thereof is shown by a thick solid line. In addition, the equivalent value of Ms is shown by a thick and long dotted line. Further, in the graph, the oval region drawn by a thick dotted line means a region in which the ternary alloy can realize an increased higher Ku value with suppressing the Ms thereof, than that of the corresponding Co—Pt binary alloy. In case where the degree of order of the formed film is increased by specifically controlling the condition in film formation, then the region is further enlarged. The region has another advantage in that the ternary alloy within the region can realize the same magnetic properties as those of the corresponding Co—Pt binary alloy even when it has a smaller Pt content.

As in claim 5, the above-mentioned preferred region has a composition comprising approximately from 10 to 35 at. % of Co, approximately from 20 to 55 at. % of Ni and a balance of Pt. The alloy film having the composition may have approximately from 1 to $2.2 \times 10^7$ erg/cm³ of Ku, somewhat allowably at most from 1 to $2.5 \times 10^7$ erg/cm³ of Ku, and the Ms value thereof could be approximately from 400 to 800 emu/cm³.

Figure 5A:
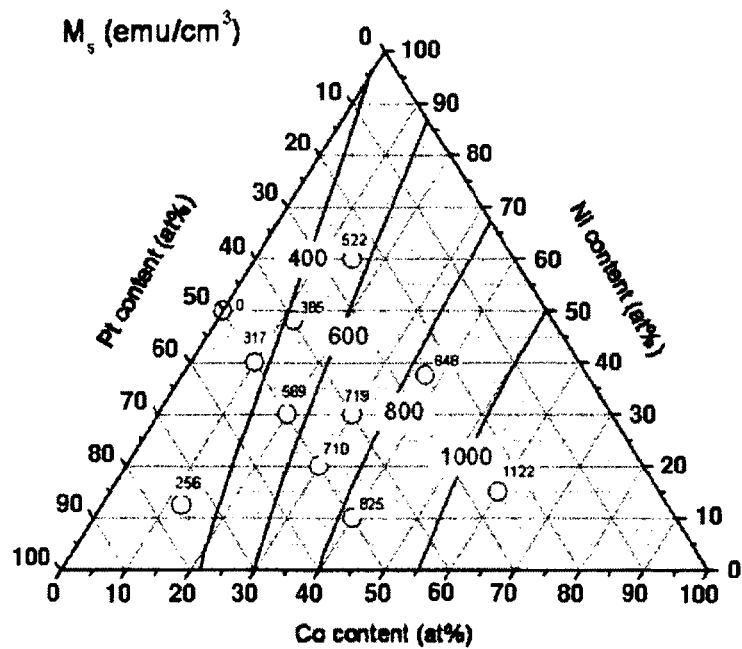
FIG. 5a is a graph showing the composition dependence of Ms of the film examples of FIG. 4.
Figure 5B:
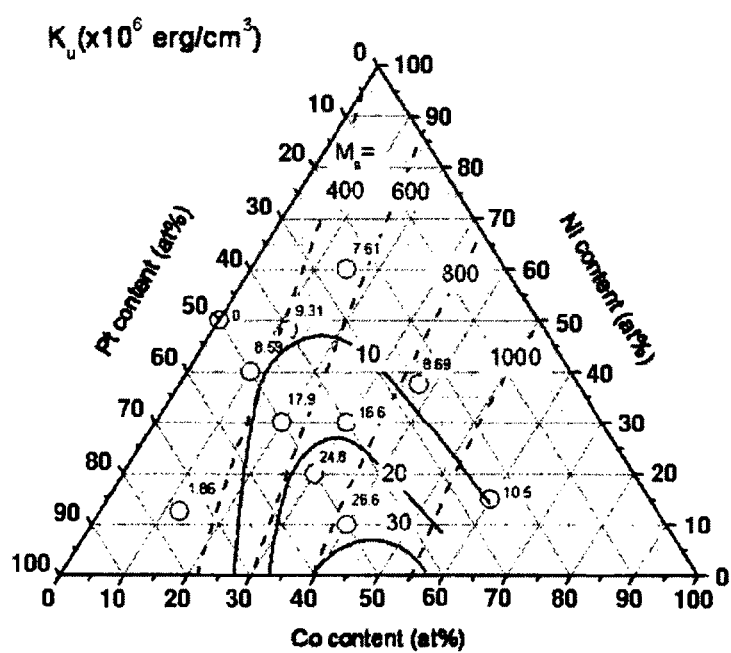
FIG. 5b is a graph showing the composition dependence of Ku thereof, as individually drawn therein.

FIG. 5 relates to the film examples of FIG. 4, and for easier understanding thereof, the composition dependence of Ms and the composition dependence of Ku are separately shown as different graphs. In the graph of FIG. 5a, the equivalent value of Ms is shown by thick solid lines; and in the graph of FIG. 5b, the equivalent value of Ku is shown by thick solid lines.

Figure 6:
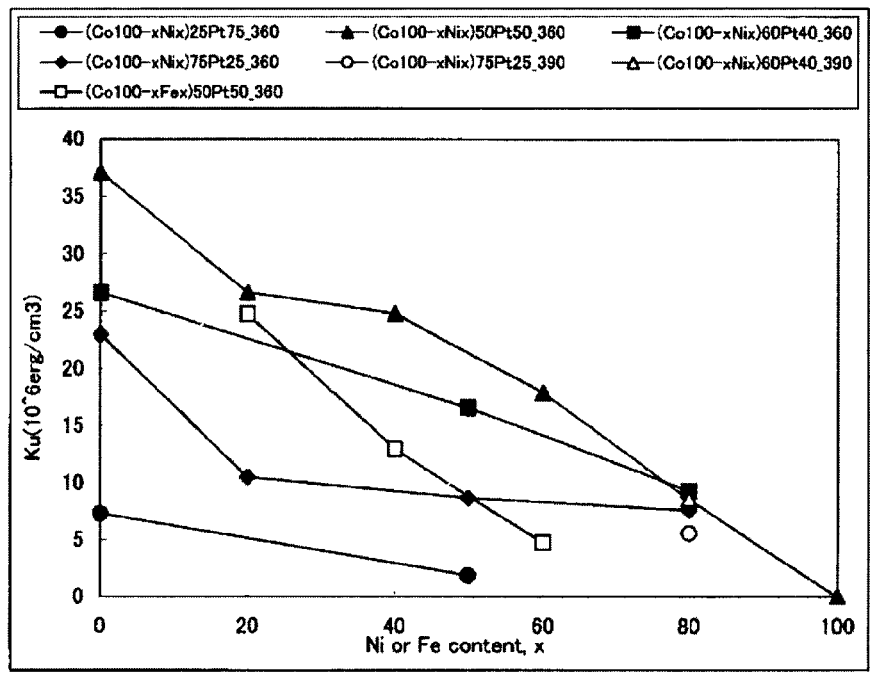
FIG. 6 is a graph showing the relationship between Ku and the Ni (or Fe) content, x of different composition examples of Co—Ni—Pt alloy or Co—Fe—Pt alloy magnetic thin films of the invention.
Figure 7:
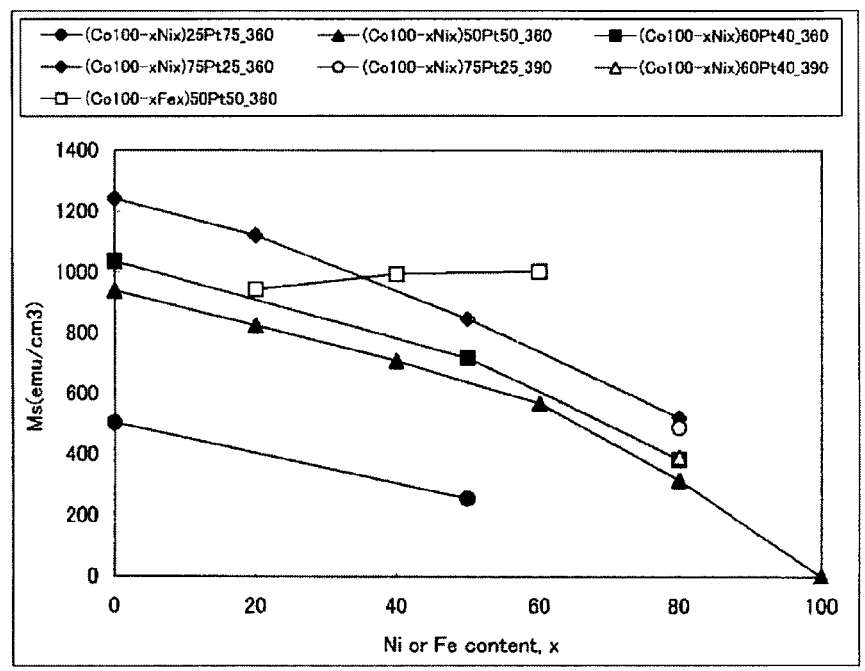
FIG. 7 is a graph showing the relationship between Ms and the Ni (or Fe) content, x of different composition examples of Co—Ni—Pt alloy or Co—Fe—Pt alloy magnetic thin films of the invention.

Next described are FIG. 6 and FIG. 7. FIG. 6 and FIG. 7 both relate to magnetic thin films of a Co—Ni—Pt alloy or a Co—Fe—Pt alloy of the invention; and FIG. 6 shows the relationship between Ku and the Ni (or Fe) content, x of different alloy compositions, while FIG. 7 shows the relationship between Ms and the Ni (or Fe) content, x thereof.

The $L1_1$-type ordered alloys shown in FIG. 6 and FIG. 7 were formed in an ultra-high vacuum (UHV) DC magnetron sputtering apparatus (ANELVA, E8001). The ultimate vacuum degree before the start of film formation was at most $7 \times 10^{-7}$ Pa. In sputtering, used was an ultra-high purity gas having an impurity concentration of from 2 to 3 ppb was used. As the substrate, used was an MgO (111) monocrystalline substrate. Between the Co-M-Pt alloy (Co—Ni—Pt alloy or Co—Fe—Pt alloy) and the substrate, provided was a Pt underlayer; and on the Co-M-Pt alloy, provided was a Pt cap layer. The thickness of the Pt underlayer, the Co-M-Pt alloy layer and the Pt cap layer was 20 nm, 10 nm and 2 nm, respectively.

The substrate temperature in formation of the Co-M-Pt alloy layer was 360° C. or 390° C., for which, 360 or 390 is given to the end of the Co-M-Pt alloy composition shown at the top of FIG. 6 and FIG. 7. The Co-M-Pt alloy layer was formed according to a co-spattering method, in which the film formation speed for Co, Ni (or Fe) and Pt was within a range of from 1.4 to 4.7 nm/min, as varied depending on the alloy composition and the film formation condition.

The $L1_1$-type ordered structure of the formed film was confirmed through detection of the super-lattice diffraction line in the X-ray diffraction pattern to be mentioned below. The saturation magnetization, Ms was measured with a vibrating sample magnetometer (VSM). The uniaxial magnetic anisotropy, Ku was determined according to a generalized Sucksmith-Thompson (GST) method. Ku may also be measured with a torque magnetometer.

FIG. 6 indicates that, even when Co is substituted with Ni (or Fe) within the range shown in FIG. 6, the alloys all still have a high Ku value of about $10^7$ erg/cm³ or more. FIG. 7 indicates that, even when Co is substituted with Ni (or Fe), Ms of the alloys still covers a broad range of approximately from 400 to 1200 emu/cm³.

In the examples of FIG. 6 and FIG. 7, the data of Ku and Ms of the alloys mostly tend to decrease with the increase in the ratio of substitution of Co with Ni or (Fe); and the data of Ms of the Co—Fe—Pt alloys tend to change little with the increase in the ratio of Fe therein. However, the results of the examples expressed by ternary meshes in FIG. 4 or FIG. 5 do not always support the above-mentioned tendency but show different tendencies depending on the alloy composition. Anyhow, from the examples of FIGS. 4 to 7, it is obvious that Ku and Ms of the alloys can be controlled by changing the alloying ingredients.

Figure 8:
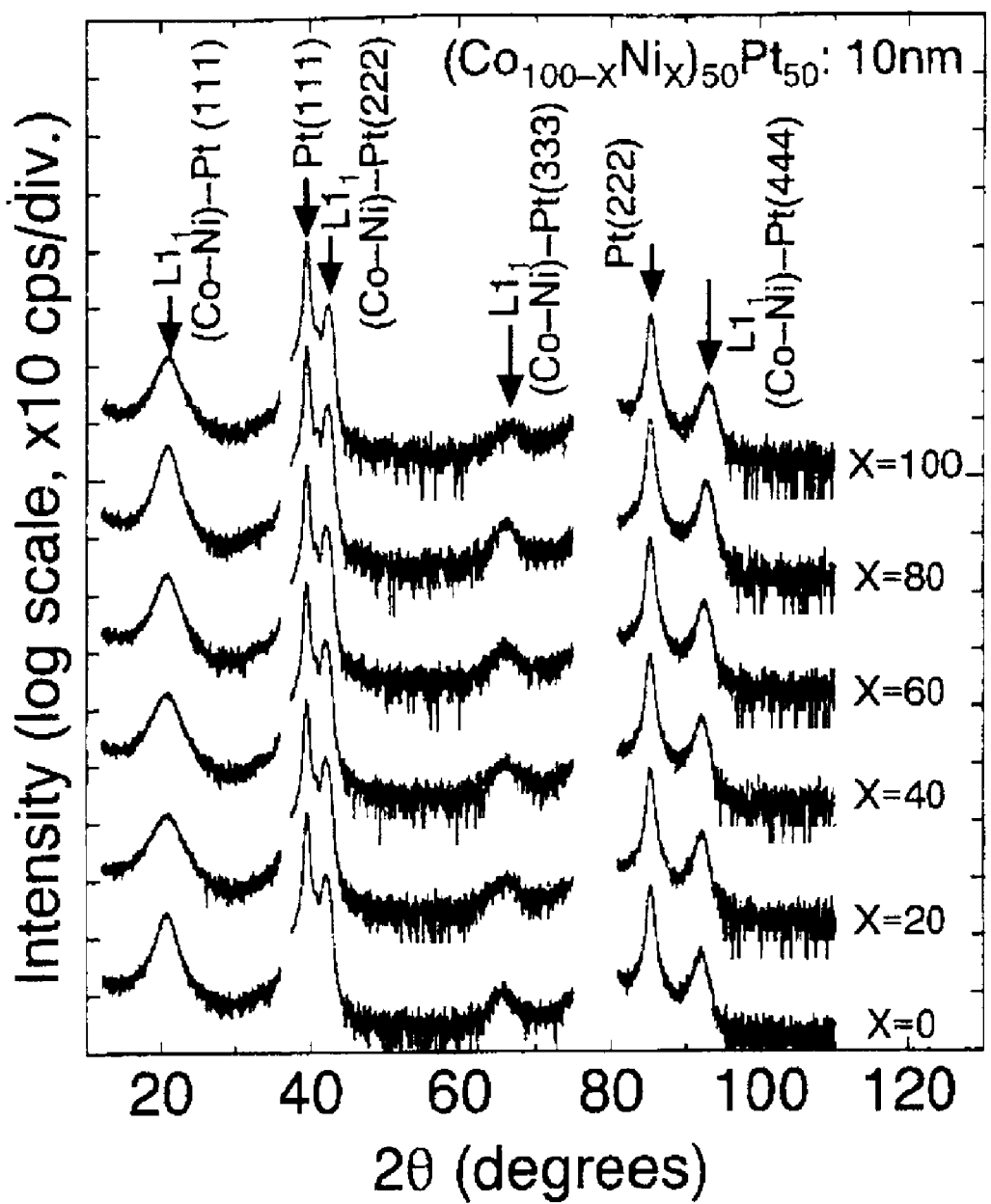
FIG. 8 is a graph showing the dependence on the Ni content, as x, of the X-ray diffraction pattern of a composition $(Co_{100-x}Ni_x)_{50}Pt_{50}$ formed on an MgO (111) substrate of the invention.

Next described is FIG. 8. FIG. 8 is a graph showing the dependence on the Ni content, as x, of the X-ray diffraction pattern of an alloy composition $(Co_{100-x}Ni_x)_{50}Pt_{50}$ formed on an MgO (111) substrate of the invention. In these examples, the substrate temperature was set at 360° C., and the underlayer of the thin film was made of Pt.

Every example gave only the diffraction line from the closest packed plane, which confirms that the closest packed plane is oriented in parallel to the film surface. In addition, the patterns gave diffraction lines on $L1_1$-(111) plane and $L1_1$-(333) plane caused by the atomic periodicity in every double-atomic layer, therefore realizing an $L1_1$-type ordered structure. All the thin films had a high Ku level with a magnetization easy axis in the direction perpendicular to the film surface (<111> direction), therefore supporting the ordering to the $L1_1$-type. In case where the $L1_1$-type is not formed, then the crystal structure in the corresponding composition region is fcc, and in that case, the magnetic anisotropy is not uniaxial and it is easy to estimate that the absolute value of the magnetic anisotropy is at most $1 \times 10^6$ erg/cm³. Strictly, the spacing in the direction perpendicular to the film surface decreases in some degree owing to the regularization of the L1$_1$-type atomic configuration; however, for evading confusions herein, the index expression is based on a cubic crystal system.

Next described are embodiments of devices to which the magnetic thin film of the invention is applied. The magnetic thin film is applicable to perpendicular magnetic recording media, tunnel magneto-resistance (TMR) devices, magnetoresistive random access memories (MRAM), MEMS devices and the like as described in the section of Background Art given above, therefore realizing good devices favorable for the needs thereof.

This application is based on and claims priority to Japanese Patent Application 2008-193156, filed on Jul. 28, 2008. The disclosure of the priority application in its entirety, including the drawings, claims, and the specification thereof, is incorporated herein by reference.

What is claimed is:

1. A magnetic thin film comprising a Co-M-Pt alloy having an L11-type ordered structure, wherein the Co-M-Pt alloy is one of the following:
   a Co—Ni—Pt alloy or a Co—Ni-M2-Pt alloy in which M2 represents one or more metal elements excluding Co, Ni and Pt, or
   a Co—Fe—Pt alloy or a Co—Fe-M3-Pt alloy in which M3 represents one or more metal elements excluding Co, Fe and Pt.

2. The magnetic thin film according to claim 1, wherein the magnetization easy axis of the film is oriented perpendicularly to the film surface.

3. The magnetic thin film according to claim 1, wherein the Co-M-Pt alloy is either a Co—Ni—Pt alloy or a Co—Ni-M2-Pt alloy in which M2 represents one or more metal elements excluding Co, Ni and Pt.

4. The magnetic thin film according to claim 1, wherein the Co-M-Pt alloy is a Co—Ni—Pt alloy comprising from 10 to 35 at. % of Co, from 20 to 55 at. % of Ni and a balance of Pt.

5. The magnetic thin film according to claim 1, wherein the Co-M-Pt alloy is either a Co—Fe—Pt alloy or a Co—Fe-M3-Pt alloy in which M3 represents one or more metal elements excluding Co, Fe and Pt.

6. A method for forming a magnetic thin film of claim 1 on a substrate using a high-vacuum magnetron sputtering method, wherein the substrate temperature is within a range of from 150° C. to 500° C. and the degree of vacuum before film formation is at most 1×10$^{-4}$ Pa.

7. The method for forming a magnetic thin film according to claim 6, wherein the substrate temperature is from 270° C. to 400° C.

8. The method for forming a magnetic thin film according to claim 7, wherein the degree of vacuum is at most 7×10$^{-7}$ Pa.

9. A magnetic thin film according to claim 1, where said film has a granular structure that comprises
   (i) ferromagnetic crystal grains of mainly a Co-M-Pt alloy having an L11-type ordered structure, wherein the Co-M-Pt alloy is one of the following:
   a Co—Ni—Pt alloy or a Co—Ni-M2-Pt alloy in which M2 represents one or more metal elements excluding Co, Ni and Pt, or
   a Co—Fe—Pt alloy or a Co—Fe-M3-Pt alloy in which M3 represents one or more metal elements excluding Co, Fe and Pt
   and
   (ii) a non-magnetic grain boundary surrounding the ferromagnetic crystal grains.

10. The magnetic thin film according to claim 9, wherein the magnetization easy axis of the film is oriented perpendicularly to the film surface.

11. The magnetic thin film according to claim 9, wherein the Co-M-Pt alloy is either a Co—Ni—Pt alloy or a Co—Ni-M2-Pt alloy in which M2 represents one or more metal elements excluding Co, Ni and Pt.

12. The magnetic thin film according to claim 9, wherein the Co-M-Pt alloy is a Co—Ni—Pt alloy comprising from 10 to 35 at. % of Co, from 20 to 55 at. % of Ni and a balance of Pt.

13. The magnetic thin film according to claim 9, wherein the Co-M-Pt alloy is either a Co—Fe—Pt alloy or a Co—Fe-M3-Pt alloy in which M3 represents one or more metal elements excluding Co, Fe and Pt.

14. A method for forming a magnetic thin film of claim 9 on a substrate using a high-vacuum magnetron sputtering method, wherein the substrate temperature is within a range of from 150° C. to 500° C. and the degree of vacuum before film formation is at most 1×10$^{-4}$ Pa.

15. A perpendicular magnetic recording medium comprising:
   a substrate, and
   at least a magnetic layer formed on said substrate,
   wherein the magnetic layer is a magnetic thin film comprising a Co-M-Pt alloy having an L11-type ordered structure, wherein the Co-M-Pt alloy is one of the following:
   a Co—Ni—Pt alloy or a Co—Ni-M2-Pt alloy in which M2 represents one or more metal elements excluding Co, Ni and Pt, or
   a Co—Fe—Pt alloy or a Co—Fe-M3-Pt alloy in which M3 represents one or more metal elements excluding Co, Fe and Pt.

16. A perpendicular magnetic recording medium according to claim 15, wherein said magnetic thin film has a granular structure that comprises (i) ferromagnetic crystal grains of mainly a Co-M-Pt alloy having an L11-type ordered structure, wherein M represents one or more metal elements excluding Co and Pt, the Co-M-Pt alloy is one of the following:
   a Co—Ni—Pt alloy or a Co—Ni-M2-Pt alloy in which M2 represents one or more metal elements excluding Co, Ni and Pt, or
   a Co—Fe—Pt alloy or a Co—Fe-M3-Pt alloy in which M3 represents one or more metal elements excluding Co, Fe and Pt
   and
   (ii) a non-magnetic grain boundary surrounding the ferromagnetic crystal grains.

17. A tunnel magneto-resistance (TMR) device comprising a magnetic thin film which comprises a Co-M-Pt alloy having an L11-type ordered structure, wherein the Co-M-Pt alloy is one of the following:
   a Co—Ni—Pt alloy or a Co—Ni-M2-Pt alloy in which M2 represents one or more metal elements excluding Co, Ni and Pt, or
   a Co—Fe—Pt alloy or a Co—Fe-M3-Pt alloy in which M3 represents one or more metal elements excluding Co, Fe and Pt.

18. A magnetoresistive random access memory (MRAM) comprising a magnetic thin film which comprises a Co-M-Pt alloy having an L11-type ordered structure, wherein the Co-M-Pt alloy is one of the following:
   a Co—Ni—Pt alloy or a Co—Ni-M2-Pt alloy in which M2 represents one or more metal elements excluding Co, Ni and Pt, or a Co—Fe—Pt alloy or a Co—Fe-M3-Pt alloy in which M3 represents one or more metal elements excluding Co, Fe and Pt.

19. An MEMS device comprising a magnetic thin film which comprises a Co-M-Pt alloy having an L11-type ordered structure, wherein the Co-M-Pt alloy is one of the following:

a Co—Ni—Pt alloy or a Co—Ni-M2-Pt alloy in which M2 represents one or more metal elements excluding Co, Ni and Pt, or a Co—Fe—Pt alloy or a Co—Fe-M3-Pt alloy in which M3 represents one or more metal elements excluding Co, Fe and Pt.

* * * * *